United States Patent
Matters-Kammerer

(10) Patent No.: US 7,471,170 B2
(45) Date of Patent: Dec. 30, 2008

(54) MULTILAYER STACK WITH COMPENSATED RESONANT CIRCUIT

(75) Inventor: Marion Kornelia Matters-Kammerer, Limbricht (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/549,883

(22) PCT Filed: Mar. 17, 2004

(86) PCT No.: PCT/IB2004/000772

§ 371 (c)(1),
(2), (4) Date: Sep. 16, 2005

(87) PCT Pub. No.: WO2004/084405

PCT Pub. Date: Sep. 30, 2004

(65) Prior Publication Data

US 2006/0171096 A1 Aug. 3, 2006

(30) Foreign Application Priority Data

Mar. 21, 2003 (EP) .................................. 03100736

(51) Int. Cl.
*H03H 7/01* (2006.01)
(52) U.S. Cl. ...................................... 333/185; 333/219
(58) Field of Classification Search ................. 333/185, 333/204, 219
See application file for complete search history.

(56) References Cited

U.S. PATENT DOCUMENTS 4,352,076 A * 9/1982 Saitoh et al. ................. 333/204
5,124,675 A * 6/1992 Komazaki et al. ........... 333/204
5,374,909 A * 12/1994 Hirai et al. ................... 333/204

* cited by examiner

*Primary Examiner*—Benny Lee

(57) ABSTRACT

A metallization structure in a multilayer stack, which is arranged at a distance from a ground electrode, is characterized in that the metallization structure has a capacitor electrode and a line that acts as a coil, where the capacitor electrode and the line are arranged in a common plane which lies parallel with the ground electrode at a distance $h_1$, and in that formula (I) where w is the width of the line.

20 Claims, 6 Drawing Sheets

MULTILAYER STACK WITH COMPENSATED RESONANT CIRCUIT

The invention relates to a metallization structure in a multilayer stack comprising a number of dielectric layers that are arranged above and below a ground electrode.

In current electronic circuits, a very high integration density of electrical functions on a small volume or small area is desired. This may be achieved, for example, using a three-dimensional circuit arrangement in a multilayer process. In the case of integrated electrical resonant circuits which are produced using planar technology, for example using multilayer laminate processes and Low Temperature Cofire Ceramic (LTCC) processes, capacitors and coils having metal structures are incorporated in the multilayer substrate. The integration of capacitors in such multilayer circuits is nevertheless only possible to a limited extent. This is because many multilayer processes exhibit fluctuations in the layer thickness, with the statistical fluctuation in layer thicknesses often being up to 10%, and since the capacitance of a plate capacitor changes as a function of the layer thickness of the dielectric layer between the electrodes an integrated capacitor would also fluctuate by 10% of its capacitance. This leads to corresponding fluctuations in the electrical response of the integrated functions, and the frequency of a filter designed with integrated coils and capacitors cannot be kept constant in accordance with the specifications. Nowadays, therefore, in multilayer stacks many components are still soldered onto the circuit as external components, with these being checked for their set value prior to assembly. The capacitors are sorted in terms of their capacitance and exhibit variations of typically less than 5%. These external components limit the miniaturization and entail higher costs on account of the assembly. In addition, the soldering process used for these external components in the assembly has a higher error rate than would be the case for integrated capacitors, and thus often leads to failure of the product.

An alternative solution would be to very carefully monitor the layer thicknesses during the process. However, this is only possible with a high level of complexity.

In some circuits, such as the high frequency circuit of a Bluetooth device for example, more than ten resonant circuits consisting of a capacitor and a coil are required. The external components required for these circuits represent a considerable part of the overall number of external components. It would therefore be desirable to integrate these resonant circuits into a multilayer stack without the variations in layer thickness brought about by the process having a significant effect on the electrical response of the resonant circuit.

The circuit of FIG. 1(a) shows a grounded series resonant circuit, consisting of a coil L1 and a grounded capacitor C1. At the resonant frequency of the resonant circuit, a high frequency signal is reflected, since the resonant circuit at this frequency acts as a short circuit.

Figure 1A:
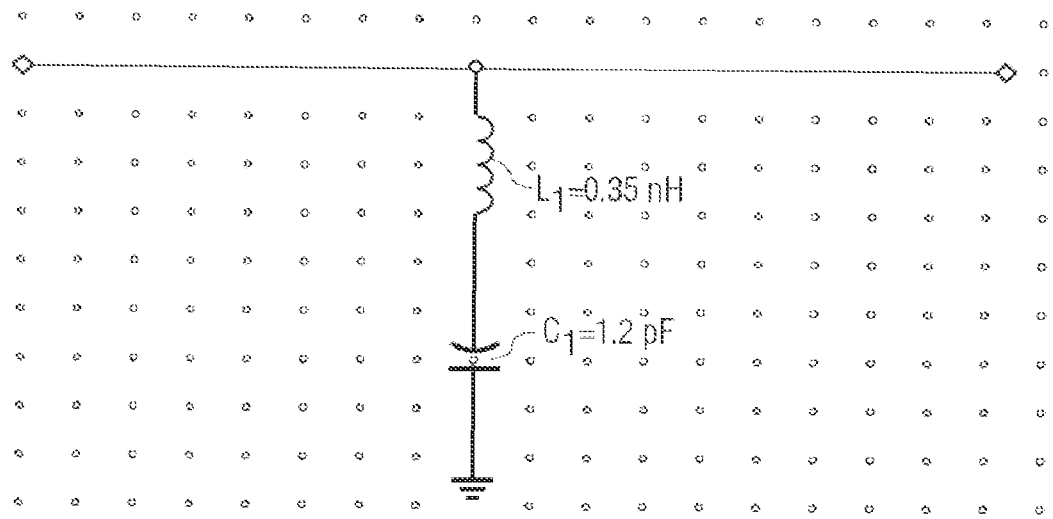
FIG. 1(b) shows the three-dimensional design of the resonant circuit.
FIG. 1(c) shows the transmission characteristic for a high-frequency signal for layer thicknesses varying by 10%. The transmission characteristic changes with thickness; in particular the resonant frequency is shifted.

It is an object of the present invention to provide a metallization structure in a multilayer stack having a number of dielectric layers, which metallization structure makes it possible to integrate resonant circuits into the stack, with layer thickness fluctuations being compensated such that they do not or practically do not affect the electrical response of the resonant circuit.

According to the invention, the metallization structure has a capacitor electrode and a line that acts as a coil, where the capacitor electrode and the line are arranged in a common plane which lies parallel to a ground electrode at a distance $h_1$. The ratio of the width w of the line to $h_1$ is greater than 3.

According to a preferred refinement, a second ground electrode may be provided, the common plane with the capacitor electrode and line being arranged parallel to said second ground electrode at a distance $h_2$. The common plane with the capacitor electrode and line lies between the first and second ground electrodes.

According to the invention, in a multilayer stack having a metallization structure as defined above, it is also provided that this metallization layer is arranged on a dielectric layer, the dielectric constant $\epsilon_{medium}$ of which is greater than the dielectric constant $\epsilon$ of the surrounding dielectric layers. "Surrounding layers" means the layers adjoining the layer having the dielectric constant $\epsilon_{medium}$. The dielectric constant of such surrounding layers is represented by $\epsilon$, and the thickness of such surrounding layers is represented by $d_\epsilon$. It has been found that, in such an arrangement, variations in the layer thickness of the dielectric layer having the dielectric constant $\epsilon_{medium}$ only very slightly affect the transmission characteristic or the shift in resonant frequency. If, specifically within the dielectric layer, the layer thickness decreases, the capacitance of the capacitor is increased. At the same time, the metal line is located closer to the ground electrode. This line acts as a coil. At the ground electrode, mirror currents are induced which lower the inductance of the line. The closer the line is to the ground electrode, the lower the inductance of the line. The product of capacitance and inductance thus remains approximately constant and hence so does the resonant frequency $$f = \frac{1}{2\pi\sqrt{L \cdot C}}$$

of the circuit. Inversely, when the layer thickness increases the capacitance of the capacitor becomes smaller, while the inductance of the line becomes greater. As a result, the product LC again remains approximately constant.

According to one preferred refinement, the following applies in respect of the dielectric constants $$\epsilon \leq \epsilon_{medium}$$

The layer thickness of the dielectric layer $d_{medium}$ having the dielectric constant $\epsilon_{medium}$ should preferably be selected such that $$\frac{\varepsilon_{medium} \cdot d_\varepsilon}{\varepsilon \cdot d_{medium}} > 5,$$

so that the metallization structure that is next in the vertical direction is well decoupled. In respect of the decoupling in the horizontal direction, the following should apply $$\frac{\varepsilon_{medium} \cdot d_{\min}}{d_{medium} \cdot \varepsilon} > 7,$$

where $d_{min}$ is the minimum distance to the next metallization structure in the plane.

Besides dielectric layers, there may also be magnetic layers in the multilayer stack.

The multilayer stack according to the present invention may be produced in a multilayer laminate process and in particular in an LTCC process.

The invention finds application in electrical modules for implementing a filter function for high frequency signals.

The invention will be further described with reference to examples of embodiments shown in the drawings to which, however, the invention is not restricted.

FIG. 1(a) shows a diagram of a conventional series resonant circuit.

Figure 1B:
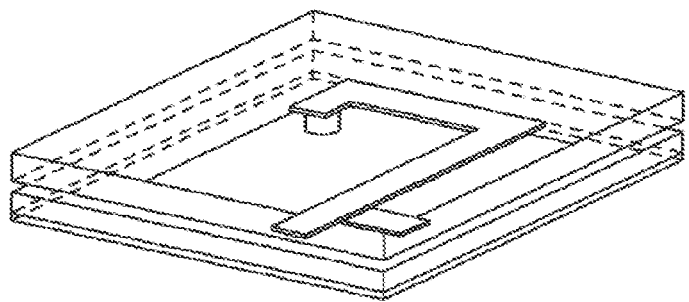

FIG. 1(b) shows the three-dimensional design of the conventional series resonant circuit of FIG. 1(a).

Figure 1C:
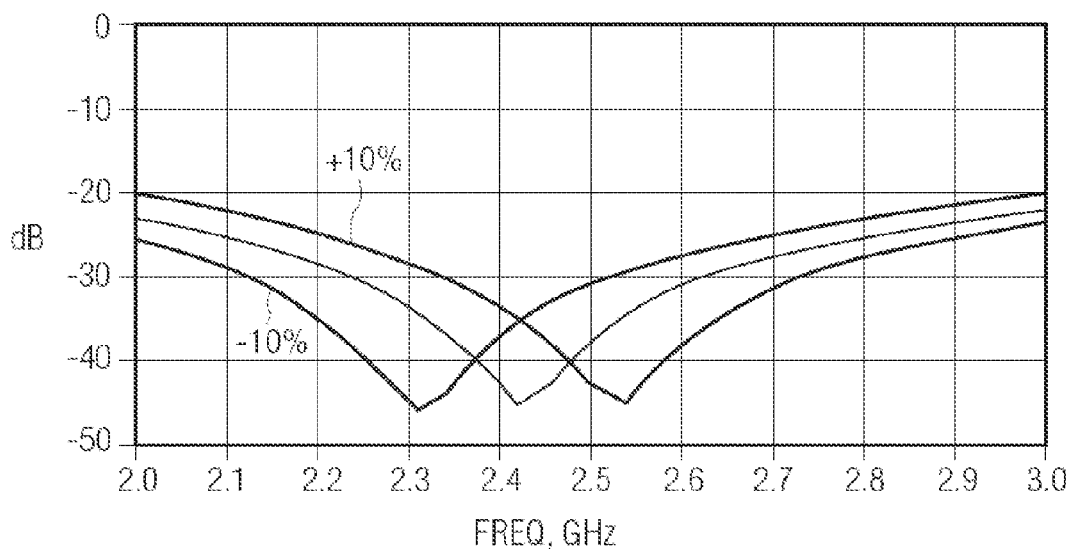

FIG. 1(c) shows that transmission characteristic of the conventional series resonant circuit of FIG. 1(a) in the case of variation of the thickness of the dielectric layer by ±10%.

Figure 2:
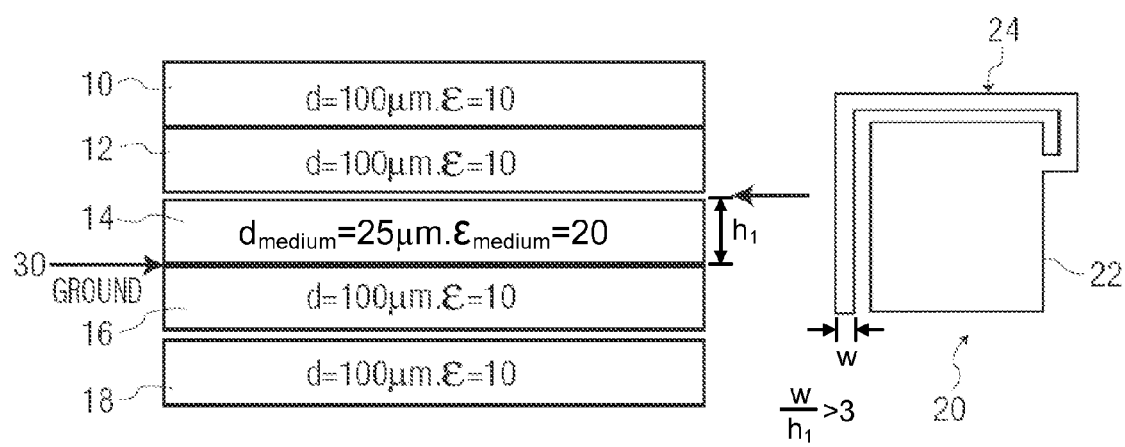

FIG. 2 shows a multilayer stack and metallization structure according to one example of embodiment of the present invention.

Figure 3:
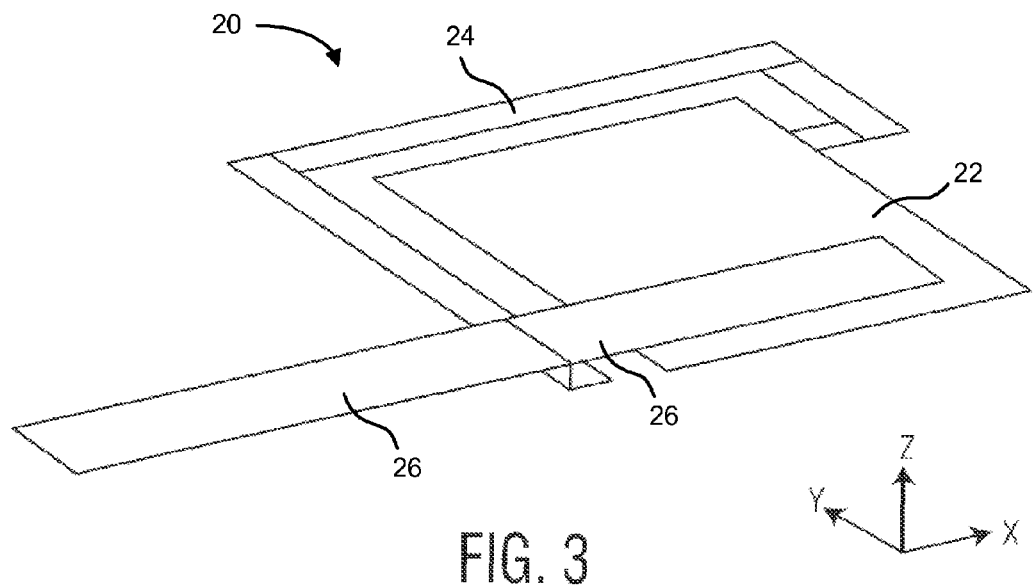

FIG. 3 shows a three-dimensional design of the metallization structure for making a resonant circuit.

Figure 4:
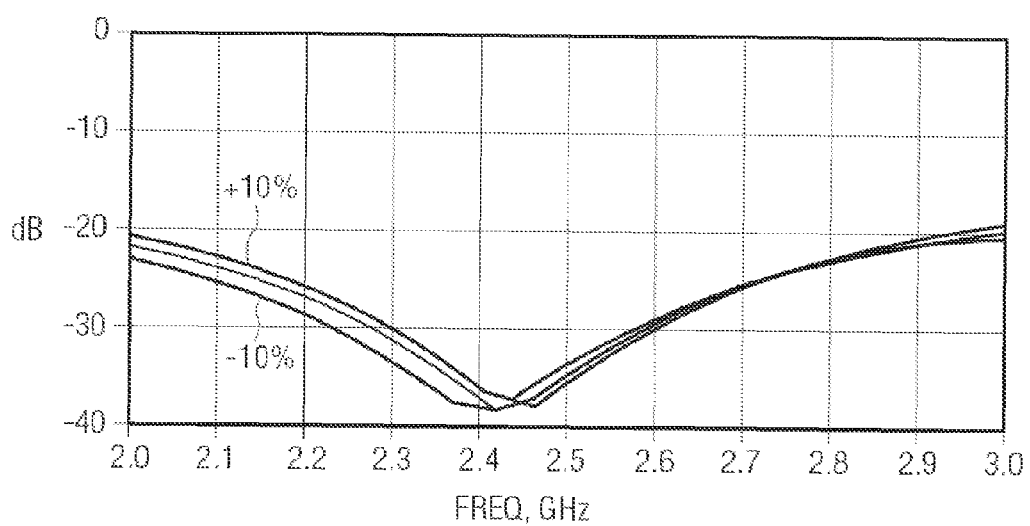

FIG. 4 shows the transmission characteristic of the metallization structure in a multilayer stack according to the invention with variation of the thickness of the dielectric layer having the dielectric constant $\epsilon_{medium}$ by ±10%.

Figure 5A:
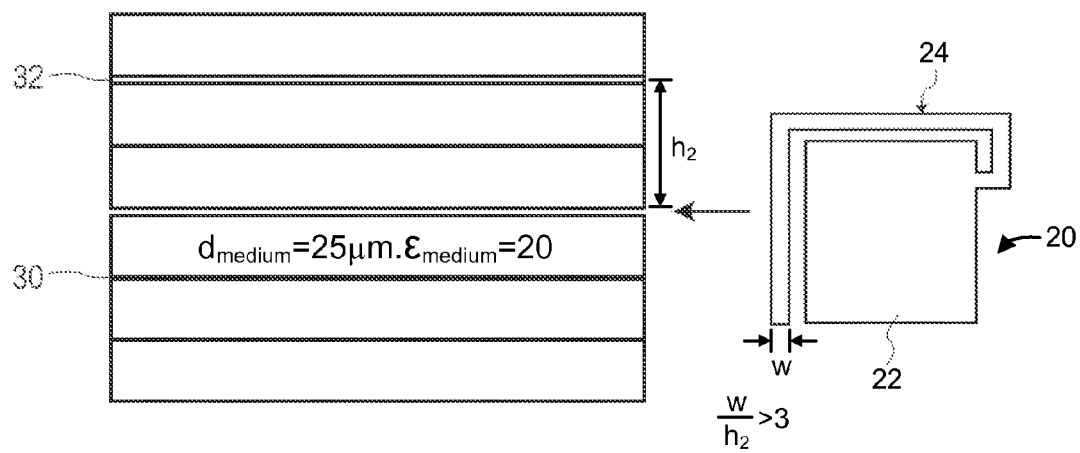

FIG. 5(a) shows the design of the multilayer stack according to the invention with an additional ground electrode.

Figure 5B:
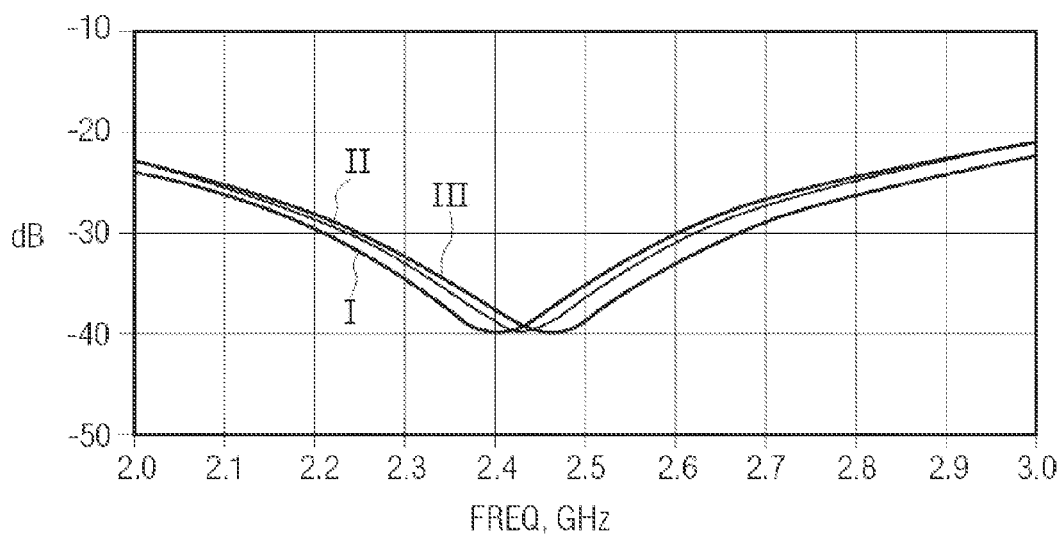

FIG. 5(b) shows the transmission characteristic of the multilayer stack of FIG. 5(a) in comparison with that of FIG. 3.

Figure 6A:
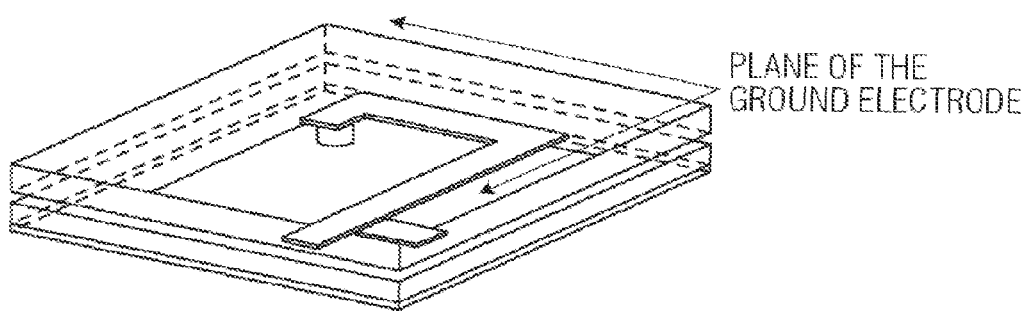

FIG. 6(a) shows a three-dimensional design of a series resonant circuit according to the prior art with additional ground electrode.

Figure 6B:
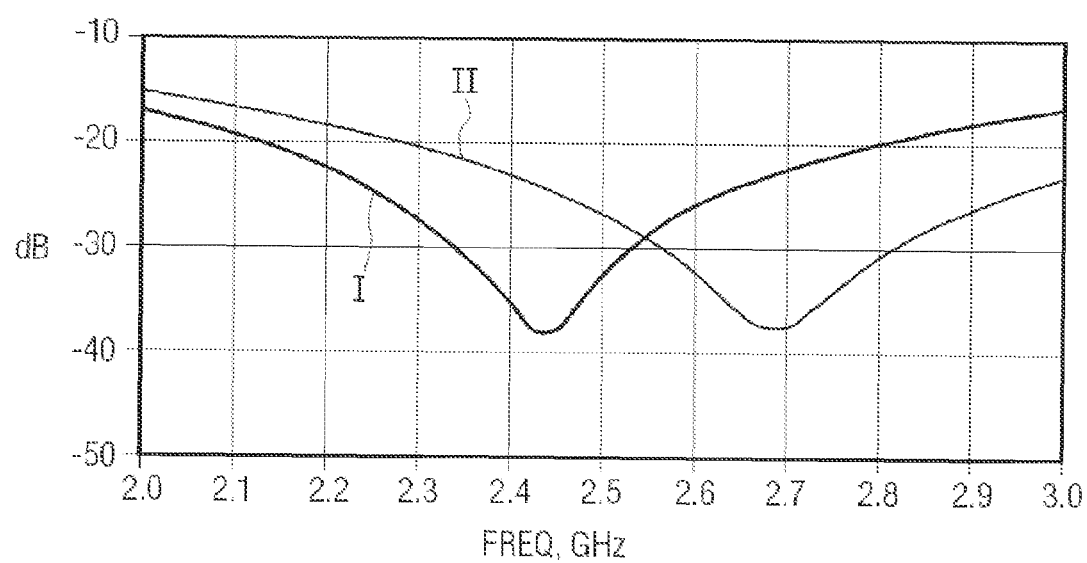

FIG. 6(b) shows the transmission characteristic without ground electrode (I) and with an additional ground electrode (II).

Figure 7:
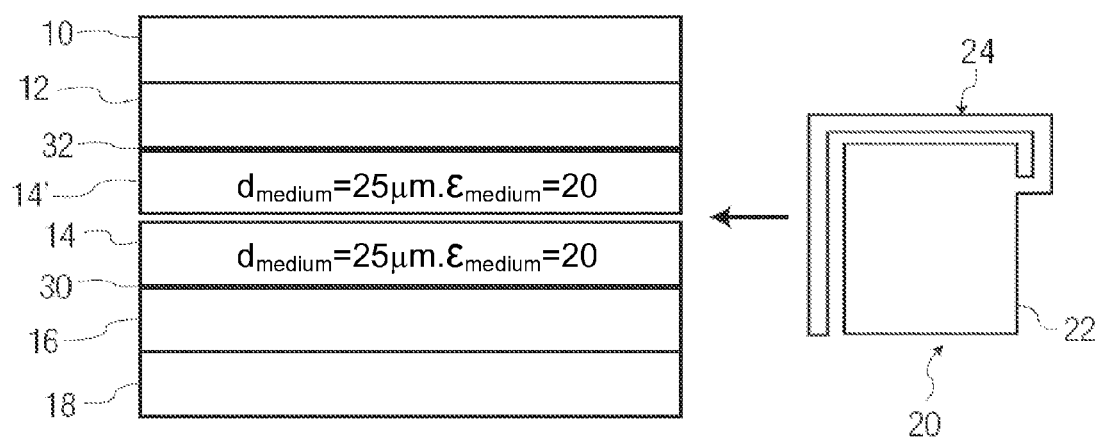

FIG. 7 shows an example of embodiment of a multilayer stack having a resonant circuit between two ground electrodes.

FIG. 2 shows an example of embodiment of a multilayer stack according to the present invention, which is made up of a number of dielectric layers 10, 12, 14, 16, 18, where the dielectric layer 14 on a ground electrode 30 has a dielectric constant which is greater, for example by a factor of 2, than the dielectric constants of the surrounding layers 12, 16. The thickness $d_{medium}$ of the dielectric layer 14 is smaller than that of the surrounding dielectric layers 12, 16 and, in order to keep the interaction with surrounding structures low, the layer thickness $d_{medium}$ should advantageously be small compared to the distances to adjacent structures, while $\epsilon$medium on the other hand should be as great as possible. It is thus possible for capacitors having sufficiently small dimensions to be integrated. A metallization structure 20 is arranged at the interface between the dielectric layer 14 and the dielectric layer 12, the metallization structure being composed of a capacitor electrode 22 and a line 24 that partially surrounds the capacitor 22. In the illustrated embodiment, w designates the width of the line 24, and $h_1$ designates a distance between the metallization structure 20 and the ground electrode 30. Also, in the illustrated embodiment, the ratio of the width w of the line 24 to the distance $h_1$ is greater than 3. In the particular embodiment illustrated in FIG. 2, for the layer 14, $d_{medium}$=25 µm, and $\epsilon_{medium}$=20. (Also in the particular embodiment illustrated in FIG. 5a, for the layer 14, $d_{medium}$=25 µm, and $\epsilon_{medium}$=20.) For adjoining layers 10, 12, 16 and 18 above and below, d=100 µm and $\epsilon$=10.

FIG. 3 shows the three-dimensional (i.e., X, Y, Z directions) design of the series resonant circuit structure 20 with the capacitor electrode 22, the line 24, and supply lines 26. As shown in FIG. 3, the capacitor electrode 22 and the supply lines 26 connect to the line 24.

The transmission of power in the circuit according to the invention is shown in FIG. 4. It can clearly be seen that variations of, for example, +10% and −10% in the layer thickness of the dielectric layer 14 lead only to a very slight change in the resonant frequency or in the overall filter curve.

The electrical response of the circuit according to the invention has great stability with respect to interaction with other metallizations which are located in the multilayer stack above and below the series resonant circuit. In the multilayer stack of FIG. 2, above the dielectric layer 12 there is no ground electrode above the metallization structure 20. FIG. 5(a) shows the design of this structure with an additional ground electrode 32 above the metallization structure 20, in addition to the ground electrode 30 below the metallization structure 20. The illustrated metallization structure 20 includes the capacitor electrode 22 and the line 24, as described above. In the illustrated embodiment, w designates the width of the line 24, $h_2$ designates a distance between the metallization structure 20 and the additional ground electrode 32, and the ratio of the width w of the line 24 to the distance $h_2$ is greater than three. FIG. 5(b) shows the transmission characteristic, where without a ground electrode (curve I) and at different distances of the additional ground electrode of 100 µm (curve II) and 200 µm (curve III) practically no variations in the resonant frequency can be seen. This effect is based on the high degree of coupling of the metallization structure 20 according to the invention to the ground electrode 30 (see FIG. 5(a)) arranged at a small distance and the advantageously relatively high dielectric constant compared to that of the surrounding layers.

For comparison purposes, in FIG. 6(a) a resonant circuit with multilayer stack according to the prior art or as shown in FIG. 1(b) is likewise provided with a further ground electrode at a vertical distance of 100 µm above the circuit. The transmission characteristic II in FIG. 6(b) shows that the upper electrode leads to a considerable shift in the resonant frequency compared to the arrangement without an additional ground electrode (curve I).

FIG. 7 shows a multilayer stack having two ground electrodes 30, 32, between which the metallization structure 20 is arranged, where between the metallization structure 20 and the ground electrodes 30 and 32 in each case dielectric layers 14 and 14', respectively, having increased dielectric constants compared to that of the surrounding layers 12, 16 are provided. Otherwise, the multiplayer stack corresponds essentially to that of FIG. 2, having other similar dielectric layers 10 and 18, as described above. Additionally, the metallization structure 20 includes a capacitor electrode 22 and a line 24, as described above. In the illustrated embodiment, for the layers 14 and 14', $d_{medium}$=25 µm, and $\epsilon_{medium}$=20.

The invention claimed is:

1. A multilayer stack comprising:
   a dielectric layer and one or more surrounding dielectric layers situated above or below the dielectric layer, a dielectric constant of the dielectric layer being greater than a dielectric constant of the surrounding dielectric layers, and
   a metallization structure which is arranged on the dielectric layer and is arranged at a distance from a ground electrode, wherein the metallization structure has a capacitor electrode and a line that acts as a coil, where the capacitor electrode and the line are arranged in a common plane which lies parallel to the ground electrode at a distance $h_1$, and wherein:

$$\frac{w}{h_1} > 3,$$

where w is the width of the line, wherein:

$$\frac{\varepsilon_{medium} \cdot d_\varepsilon}{\varepsilon \cdot d_{medium}} > 5$$

wherein the dielectric constant of and a thickness of the dielectric layer are $\varepsilon_{medium}$ and $d_{medium}$, respectively, and the dielectric constant of and a thickness of the surrounding dielectric layers are $\varepsilon$ and $d_\varepsilon$, respectively.

2. A metallization structure as claimed in claim 1, further comprising:
a second ground electrode, the common plane comprising the capacitor electrode and the line being arranged parallel to said second ground electrode at a distance $h_2$, and the common plane comprising the capacitor electrode and the line being between the first and second ground electrodes, where $$\frac{w}{h_2} > 3.$$

3. A multilayer stack as claimed in claim 2, further comprising one or more additional metallization structures in the common plane, wherein $$\frac{\varepsilon_{medium} \cdot d_{\min}}{\varepsilon \cdot d_{medium}} > 7,$$

where $d_{min}$ is the minimum distance to a nearest metallization structure in the plane, and wherein the dielectric constant of and a thickness of the dielectric layer are $\varepsilon_{medium}$ and $d_{medium}$, respectively, and the dielectric constant of the surrounding dielectric layers is $\varepsilon$.

4. A multilayer stack as claimed in claim 2, wherein the multilayer stack further comprises magnetic layers.

5. A multilayer stack as claimed in claim 2, produced in a multilayer laminate process.

6. A multilayer stack as claimed in claim 2, produced in a Low Temperature Cofire Ceramic (LTCC) process.

7. A multilayer stack comprising:
a dielectric layer and one or more surrounding dielectric layers situated above or below the dielectric layer, a dielectric constant of the dielectric layer being greater than a dielectric constant of the surrounding dielectric layers, and
a metallization structure which is arranged on the dielectric layer and is arranged at a distance from a ground electrode, wherein the metallization structure has a capacitor electrode and a line that acts as a coil, where the capacitor electrode and the line are arranged in a common plane which lies parallel to the ground electrode at a distance $h_1$, and wherein:

$$\frac{w}{h_1} > 3,$$

where w is the width of the line, wherein the multilayer stack is produced in a Low Temperature Cofire Ceramic (LTCC) process.

8. A metallization structure as claimed in claim 7, further comprising:
a second ground electrode, the common plane comprising the capacitor electrode and the line being arranged parallel to said second ground electrode at a distance $h_2$, and the common plane comprising the capacitor electrode and the line being between the first and second ground electrodes, where $$\frac{w}{h_2} > 3.$$

9. A multilayer stack as claimed in claim 8, further comprising one or more additional metallization structures in the common plane, wherein $$\frac{\varepsilon_{medium} \cdot d_{\min}}{\varepsilon \cdot d_{medium}} > 7,$$

where $d_{min}$ is the minimum distance to a nearest metallization structure in the plane, and wherein the dielectric constant of and a thickness of the dielectric layer are $\varepsilon_{medium}$ and $d_{medium}$, respectively, and the dielectric constant of the surrounding dielectric layers is $\varepsilon$.

10. A multilayer stack as claimed in claim 8, wherein the multilayer stack further comprises magnetic layers.

11. A multilayer stack as claimed in claim 8, produced in a multilayer laminate process.

12. A multilayer stack comprising:
a dielectric layer and one or more surrounding dielectric layers situated above or below the dielectric layer, a dielectric constant of the dielectric layer being greater than a dielectric constant of the surrounding dielectric layers;
a metallization structure which is arranged on the dielectric layer and is arranged at a distance from a ground electrode, wherein the metallization structure has a capacitor electrode and a line that acts as a coil, where the capacitor electrode and the line are arranged in a common plane which lies parallel to the ground electrode at a distance $h_1$, and wherein $$\frac{w}{h_1} > 3,$$

where w is the width of the line;
a second ground electrode, the common plane comprising the capacitor electrode and the line being arranged parallel to said second ground electrode at a distance $h_2$, and the common plane comprising the capacitor electrode and the line being between the first and second ground electrodes, where $$\frac{w}{h_2} > 3; \text{ and}$$

one or more additional metallization structures in the common plane, wherein $$\frac{\varepsilon_{medium} \cdot d_{\min}}{\varepsilon \cdot d_{medium}} > 7,$$

where $d_{min}$ is the minimum distance to a nearest metallization structure in the plane, and wherein the dielectric constant of and a thickness of the dielectric layer are $\varepsilon_{medium}$ and $d_{medium}$, respectively, and the dielectric constant of the surrounding dielectric layers is $\varepsilon$.

13. The multilayer stack of claim 12, $$\frac{\varepsilon_{medium} \cdot d_\varepsilon}{\varepsilon \cdot d_{medium}} > 5$$

wherein the dielectric constant of and a thickness of the dielectric layer are $\epsilon_{medium}$ and $d_{medium}$, respectively, and the dielectric constant of and a thickness of the surrounding dielectric layers are $\epsilon$ and $d_\epsilon$, respectively.

14. The multilayer stack of claim 12, wherein the multilayer stack further comprises magnetic layers.

15. The multilayer stack of claim 12, wherein the multilayer stack is produced in a multilayer laminate process.

16. The multilayer stack of claim 12, wherein the multilayer stack is produced in a LTCC process.

17. A multilayer stack comprising:
a dielectric layer and one or more surrounding dielectric layers situated above or below the dielectric layer, a dielectric constant of the dielectric layer being greater than a dielectric constant of the surrounding dielectric layers;
a metallization structure which is arranged on the dielectric layer and is arranged at a distance from a ground electrode, wherein the metallization structure has a capacitor electrode and a line that acts as a coil, where the capacitor electrode and the line are arranged in a common plane which lies parallel to the ground electrode at a distance $h_1$, and wherein $$\frac{w}{h_1} > 3,$$

where w is the width of the line;
a second ground electrode, the common plane comprising the capacitor electrode and the line being arranged parallel to said second ground electrode at a distance $h_2$, and the common plane comprising the capacitor electrode and the line being between the first and second ground electrodes, where $$\frac{w}{h_2} > 3; \text{ and}$$

magnetic layers.

18. The multilayer stack of claim 17, $$\frac{\varepsilon_{medium} \cdot d_\varepsilon}{\varepsilon \cdot d_{medium}} > 5$$

wherein the dielectric constant of and a thickness of the dielectric layer are $\epsilon_{medium}$ and $d_{medium}$, respectively, and the dielectric constant of and a thickness of the surrounding dielectric layers are $\epsilon$ and $d_\epsilon$, respectively.

19. The multilayer stack of claim 17, wherein the multilayer stack is produced in a multilayer laminate process.

20. The multilayer stack of claim 17, wherein the multilayer stack is produced in a LTCC process.

* * * * *